(12) United States Patent
Alijabbari et al.

(10) Patent No.: US 10,425,040 B2
(45) Date of Patent: Sep. 24, 2019

(54) BALANCED UNILATERAL FREQUENCY QUADRUPLER

(71) Applicant: University of Virginia, Charlottesville, VA (US)

(72) Inventors: Naser Alijabbari, Elkridge, MD (US); Robert M. Weikle, II, Crozet, VA (US); Matthew Bauwens, Chesapeake, VA (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 0 days.

(21) Appl. No.: 15/507,555

(22) PCT Filed: Aug. 28, 2015

(86) PCT No.: PCT/US2015/047592
§ 371 (c)(1),
(2) Date: Feb. 28, 2017

(87) PCT Pub. No.: WO2016/033559
PCT Pub. Date: Mar. 3, 2016

(65) Prior Publication Data
US 2017/0288607 A1 Oct. 5, 2017

Related U.S. Application Data

(60) Provisional application No. 62/043,698, filed on Aug. 29, 2014.

(51) Int. Cl.
*H03B 19/18* (2006.01)
*G06F 7/68* (2006.01)
*H03D 7/16* (2006.01)

(52) U.S. Cl.
CPC ............. *H03B 19/18* (2013.01); *G06F 7/68* (2013.01); *H03D 7/166* (2013.01); *H03B 2200/0078* (2013.01)

(58) Field of Classification Search
CPC .................... H03B 19/00; H03B 19/18
See application file for complete search history.

(56) References Cited

U.S. PATENT DOCUMENTS 5,475,349 A 12/1995 Cohn
6,124,742 A * 9/2000 Cook ............... H03B 19/14
327/116

(Continued)

FOREIGN PATENT DOCUMENTS

EP 1 313 209 A1 5/2003
WO 98/42486 A1 10/1998

(Continued)

OTHER PUBLICATIONS

International Search Report dated Dec. 29, 2015, issued in counterpart International Application No. PCT/US2015/047592 (1 page).

(Continued)

*Primary Examiner* — Hai L Nguyen
(74) *Attorney, Agent, or Firm* — Westerman, Hattori, Daniels & Adrian, LLP

(57) ABSTRACT

An integrated frequency quadruplet consists of a pair of balanced frequency doublers that are driven in phase quadrature using a hybrid coupler. This approach results, effectively, in a "unilateral" multiplier that presents a match to the input-driving source, irrespective of the impedance of the doubler stages. The present invention applies this architecture to implement an integrated frequency quadruplet with output frequency of 160 GHz using quasi vertical GaAs varactors fabricated on thin silicon support membranes. The quadruplet has a balanced circuit architecture that addresses degradation issues often arising from impedance mis- (Continued)

matches between multiplier stages. A unique quasi-vertical diode process is used to implement the quadruplet, resulting in an integrated drop-in chip module that incorporates 18 varactors, matching networks and beamleads for mounting. The chip is tailored to fit a multiplier waveguide housing resulting in high reproducibility and consistency in manufacture and performance.

9 Claims, 8 Drawing Sheets

(56) References Cited

U.S. PATENT DOCUMENTS

| | | | |
|---|---|---|---|
| 6,211,708 B1 * | 4/2001 | Klemmer | H03B 21/01 327/122 |
| 6,323,818 B1 | 11/2001 | Koh et al. | |
| 6,369,675 B2 * | 4/2002 | Yamada | H03B 19/14 327/119 |
| 6,404,402 B1 | 6/2002 | Koh et al. | |
| 7,302,011 B1 | 11/2007 | Granger-Jones | |
| 8,309,930 B2 | 11/2012 | Gelmont et al. | |
| 8,330,506 B2 * | 12/2012 | Trotta | H03D 7/12 327/119 |
| 8,933,732 B2 * | 1/2015 | Lee | H03B 19/14 327/116 |
| 2002/0057226 A1 | 5/2002 | Koh et al. | |
| 2013/0106456 A1 | 5/2013 | Weikle, II et al. | |

FOREIGN PATENT DOCUMENTS

| | | |
|---|---|---|
| WO | 98/43314 A1 | 10/1998 |
| WO | 98/47198 A2 | 10/1998 |
| WO | 2012/024007 A2 | 2/2012 |

OTHER PUBLICATIONS

J. W. Gewartowski, "Unilateral Frequency Multiplier Circuit" Proceedings of the IEEE, pp. 1749-1750, Dec. 1964.
R.D. Brooks, J. W. Gewartowski, "Unilateral 6-GHz 2 1/2-Watt Varactor Quadrupler," IEEE Trans. Solid-State Circuits vol. SC-3, No. 2, Jun. 1968, pp. 182-189.
N. Erickson, "High efficiency submillimeter frequency multipliers," in IEEE MTT-S Int. Microwave Symp. Dig., 1990, pp. 1301-1304.
N. Erickson, B. Rizzi, and T. Crowe, "A high-power doubler for 174 GHz using a planar diode array," in Proc. 4th Int. Space THz Tech. Symp., Mar. 1993, pp. 287-296.
D.W. Porterfield, et al, "A High-Power Fixed-Tuned Millimeter-Wave Balanced Frequency Doubler," IEEE Trans. Microwave Theory and Tech. vol. 47, No. 4, pp. 419-425, 1999.

* cited by examiner

BALANCED UNILATERAL FREQUENCY QUADRUPLER

CROSS-REFERENCE TO RELATED APPLICATIONS

This Application claims the benefit of U.S. Provisional Application 62/043,698, filed on Aug. 29, 2014. which is incorporated herein by reference in its entirety.

BACKGROUND OF THE INVENTION (1) Field of the Invention

The present invention relates to frequency multipliers, in general, and to multipliers using solid-state components employing quasi-vertical diode geometry for generating high-frequency millimeter and submillimeter-waves signals, in particular.

(2) Description of Related Art Including Information Disclosed Under 37 CFR §§ 1.97 and 1.98

Frequency multipliers are the most commonly used solid-state components for generating, high-frequency millimeter and submillimeter-wave signals, These components are based on a nonlinear device, typically a Schottky diode, that is driven with a low frequency, high-power source. The nonlinearities of the device produces harmonics of this input, which are subsequently extracted to realize a higher-frequency source. The most common types of frequency multipliers are doublers (which produce power at twice the input frequency) and triplers (which produce power at three times the input frequency). Doublers and triplers are most often realized with multiple-device architectures (such as anti-series or anti-parallel diode arrangements) naturally separate even and odd-order harmonics.

Extending multipliers to higher frequencies is difficult, as it typically requires complex circuits designed to idle power generated at undesired intermediate frequencies. Consequently, most high-order multipliers consist of cascaded chains of doublers and triplers with intermediate "matching" stages designed to optimize the impedance seen by each preceding multiplier stage, Unwanted reflections at these intermediate stages can detrimentally affect the performance of a multiplier driving other multipliers, thus reducing efficiency and bandwidth. Consequently, isolators or other lossy circuits are often used between stages to reduce such loading effects. This reduces the overall efficiency of the chain and places increased demand on the power handling of earlier stages as the entire chain must often be driven with higher levels of power to achieve a given, target output power.

Frequency multipliers based on Schottky barrier diodes represent the most commonly used solid-state device technology for generating power at frequencies ranging from 100 GHz, to 1 THz. Over the years, these devices have remained critical to a variety of submillimeter-wave heterodyne-based instruments including radiometers for space-borne applications, receivers for ground-based radio astronomy, and sources for vector network analyzer frequency extenders. The design of varactor multipliers is well established. From this foundation, a number of preferred multiplier circuit topologies have emerged including balanced doubler and tripler configurations that employ anti-parallel or anti-series connected diodes. These circuit configurations have become commonplace due to their inherent isolation of even-order and odd-order harmonics, eliminating the need for filters.

Generation of power at frequencies approaching 1 THz typically requires many stages of multiplication as the fundamental input signal is often in the microwave range where significant (watt-level) drive power is achievable. Direct multiplication to a high-order harmonic greater than the third is usually not considered practical as proper termination of all intermediate harmonics (idlers) is a complex (and sometimes intractable) design problem. Consequently, submillimeter wave multiplier sources typically consist of a chain of doublers and triplers, selected to yield the desired output frequency. Cascading of multipliers provides a pragmatic approach, with output powers of hundreds of milliwatts being obtained in the millimeter-wave band with this technique. However, because the efficiencies for varactor doublers and triplers operating above 100 GHz are typically no greater that 25%, the overall efficiency of a large multistage chain is often substantially lower than 1%. Moreover mismatches between adjacent multipliers in a cascade can readily disturb earlier multiplier stages by pulling them from their optimum operating point, further reducing efficiencies and output power. As a result, intermediate matching or isolation networks are frequently inserted between adjacent stages, contributing to loss and system complexity. Moreover, the input stages of large multiplier chains must be capable of handling high power (several watts) to overcome the low efficiencies and produce usable output power, which is often on the order of 1 µW above 1 THz.

BRIEF SUMMARY OF THE INVENTION

It is an object of the present invention to provide novel circuit architecture for a frequency quadrupler.

It is another object of the present invention to provide an architecture that may be, for example, based on a balanced frequency doubler and incorporates a hybrid network that feeds a pair of balanced frequency doublers in quadrature. The outputs of these doublers are out of phase and are used to drive a third frequency doubler, thus producing an output signal at a frequency four times the input.

It is a further object of the present invention to provide a circuit architecture that also produces an impedance match at the input so that no power is reflected back to the source driving the quadrupler, creating a unilateral network. This permits these circuits to be used in cascade without detrimental loading effects that typically plague frequency multipliers when cascaded in a chain.

It is yet an object of the present invention to provide a new frequency multiplier architecture that may include a unilateral approach and a balanced doubler configuration to allow higher-order direct quadruplers to be realized.

An embodiment of the present invention has a balanced frequency multiplier architecture with two primary design features: (1) an integrated hybrid coupler that feeds a pair of balanced doublers in phase quadrature and (2) an integrated anti-series diode pair bridging the balanced doublers. The combination of these two features provides on example of a unique aspect or feature of an embodiment of the present invention. The two design features address, among other things, two issues with realizing high-order multipliers (with multiplication factors greater than 3): (1) loading due to reflected power from mismatches between adjacent stages of multipliers and (2) separation and idling of intermediate frequency components generated by the nonlinear devices (diodes).

The use of a quadrature hybrid coupler addresses the first issue. If the terminations (balanced doublers) at the two output ports of the coupler are identical, then any power reflected from these devices cancel at the input port and are directed to an isolation port that can be used as a "dump." Thus, if the quadrupler is driven with an input multiplier, power reflected from the quadrupler does not affect the load impedance seen by the input multiplier and thus its performance is not influenced by such mismatches. The issue of reflected power from mismatches is significant in standard multiplier chains as such reflected power can pull multipliers from their optimum operating point, reducing efficiency and power output.

The second design feature (employing a second pair of anti-series diodes) addresses the second design issue. The anti-series configuration of diodes separates odd-order and even-order harmonies of the drive signal. The balanced doublers at the output ports of the hybrid thus naturally generate a second harmonic voltage at the node where the diodes are joined. Because the two doublers are driven in quadrature at a fundamental frequency, these second-harmonic voltages generated at the two ports will be out-of-phase. Consequently, they can be used to drive a second frequency doubler that bridges the nodes of the two balanced doublers, producing a fourth-order harmonic in the output circuit without need for filters.

BRIEF DESCRIPTION OF THE DRAWINGS

The invention is better understood by reading the following Detailed Description of the Invention with references to the accompanying drawing figures, in which like reference numerals refer to like elements throughout, and in which:

FIG. 4a illustrates the input doubler circuit. FIG. 4b illustrates the output doubler circuit with an intermediate matching stage. FIG. 4c illustrates the output matching circuit and transition to a WR-6 waveguide. All dimensions noted have units of μm.

DETAILED DESCRIPTION OF THE INVENTION

Figure 1:
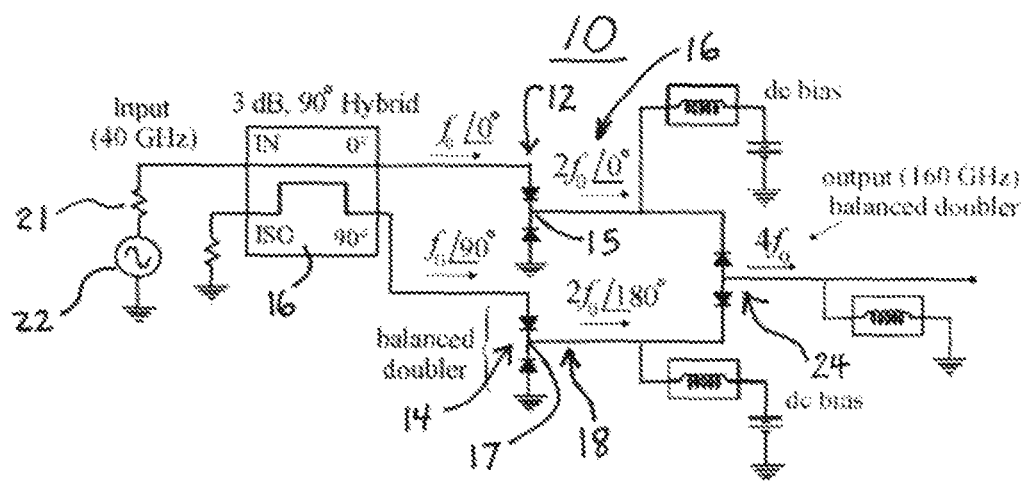
FIG. 1 is a circuit diagram of a quadrupler circuit architecture embodying the present invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

The present invention presents a frequency multiplier architecture that is intended to address a number of the issues noted above that are frequently encountered in cascaded multipliers. The circuit topology consists of a pair of balanced frequency doublers that are driven in phase quadrature using a hybrid coupler. This approach results, effectively, in a "unilateral" multiplier that presents a match to the input-driving source, irrespective of the impedance of the doubler stages. The present invention applies this architecture to implement an integrated frequency quadrupler with output frequency of 160 GHz using quasi-vertical GaAs varactors fabricated on thin silicone support membranes. Such quasi-vertical varactors and methods of making same are presented in copending U.S. patent application No. (Attorney Docket Number 151093), filed even date herewith and incorporated by reference in its entirety.

Figure 6:
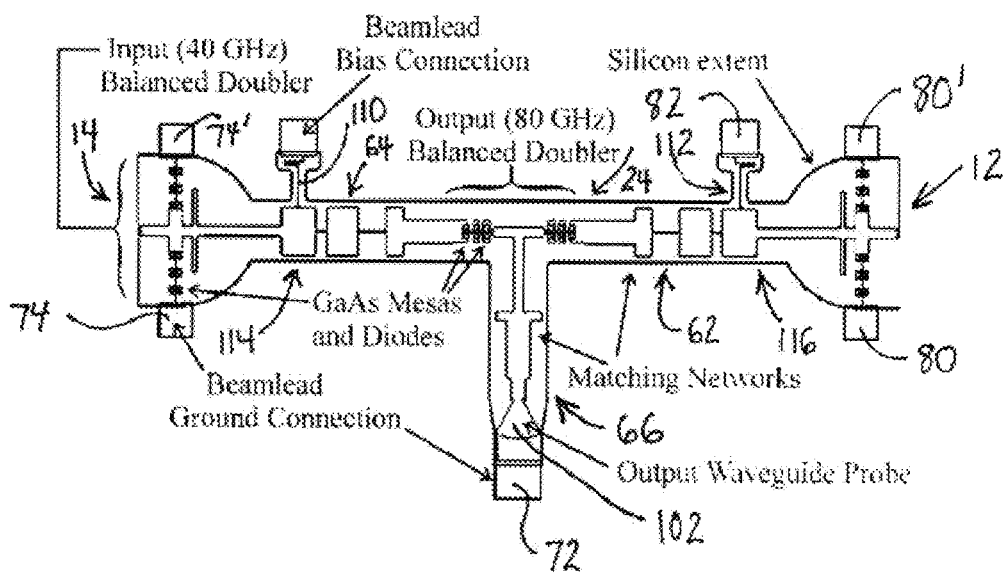
FIG. 6 is a diagram of an integrated chip of the inventive quadrupler of FIG. 1.
Figure 8:
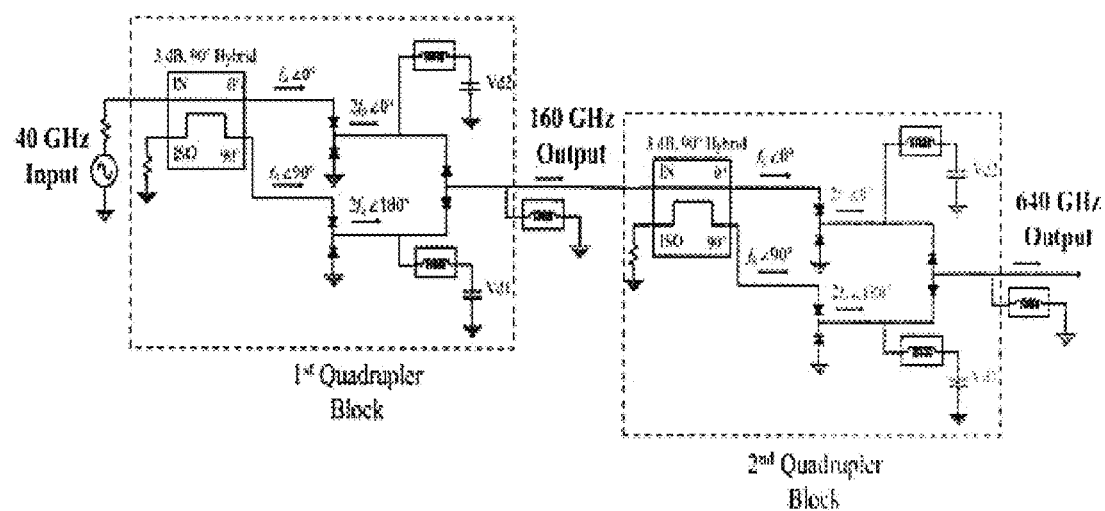
FIG. 8 is a circuit diagram of the embodiment of FIG. 1 arranged in cascade.

FIGS. 1 and 6 illustrate the basic architecture of a preferred embodiment of the quadrupler circuit 10. The input stage of the multiplier consists of a pair of balanced doublers 12, 14 that are driven through a quadrature: hybrid 16, resulting in two outputs 16, 18 at twice the fundamental input frequency fo and out-of-phase. This circuit topology is often employed for balanced amplifiers and phase-shifters, as any fundamental frequency power reflected from the inputs of the doublers (provided they are identical) is directed to the isolation port, which serves as power "dump." Consequently, the input source 22 (which may be another multiplier stage in a cascade as shown in FIG. 8) is presented with a march over the bandwidth of the hybrid 16 and is am subject to variations in loading and performance due to changes in the operating conditions of the balanced doublers 12, 14 that it drives. The intermediate outputs 16, 18 at 2fo have the proper phasing to drive a second-stage balanced doubler 24 that bridges the output nodes 15, 17 of the two input-stage doublers, thus yielding a frequency quadrupler 10.

Design of the quadrupler circuit consists essentially of two steps: determining the proper embedding impedances to present to the varactors of the input balanced doubler driven at the fundamental input frequency of fo (40 GHz) and, similarly, determining the impedances to present to the diodes of the output doubler stage driven at a frequency of 2fo (80 GHz).

Figure 2:
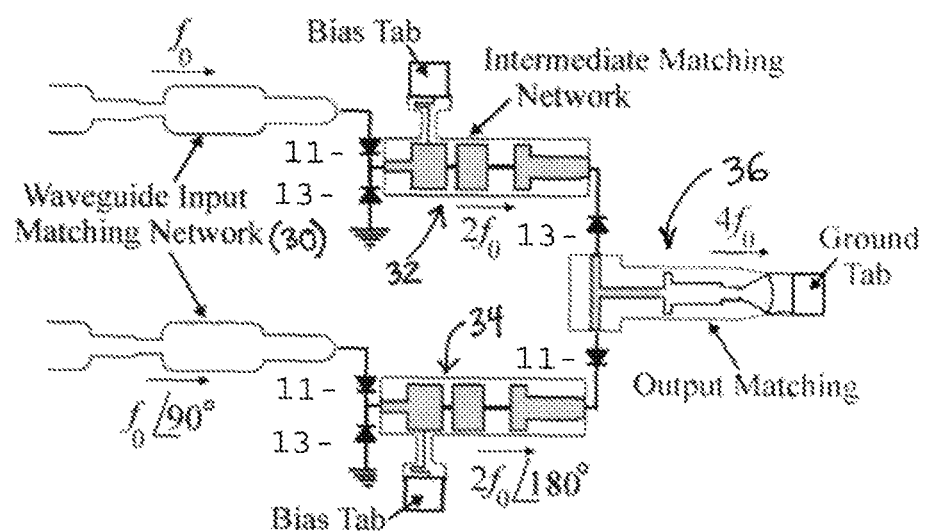
FIG. 2 is a diagram of the geometry of the quadrupler matching and filtering networks for the embodiment of FIG. 1.

FIG. 2 illustrates the three networks comprising the design: (1) a stepped impedance input matching circuit implemented in (WR-22) waveguide 30. (2) an intermediate matching/filtering network 32, 34 designed to present the proper load impedance to the input doubler and source impedance to the output doubler at 2fo and (3) a matching circuit 36 that couples the output at 4fo to a waveguide probe in the WR-5.1 band.

The input stage of the quadrupler 10 consists of a pair of identical balanced frequency doublers 12, 14, driven by the $TE_{10}$ mode of an input WR-22 (33-50 GHz) waveguide. Design of the doubler is based on an array of anti-series oriented varactors 11, 13 extending across a reduced-height waveguide to suppress excitation of the undesired $TM_{11}$ mode which has a field distribution that can couple to the opposing currents generated by the diodes at the second harmonic.

Figure 3:
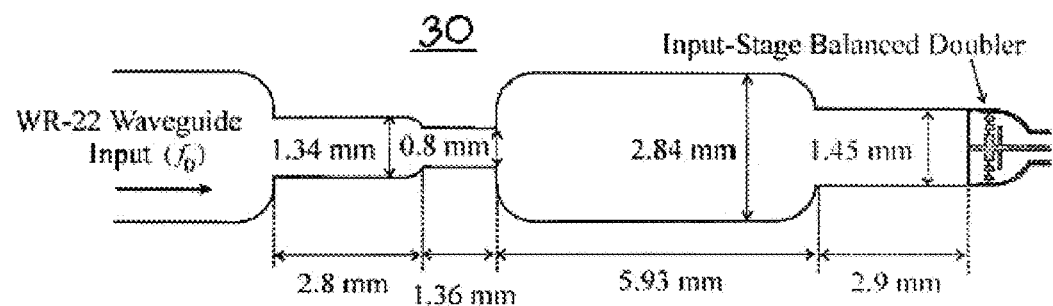
FIG. 3 is a diagram of an input waveguide network to a first-stage doubler according to the present invention.
Figure 4A:
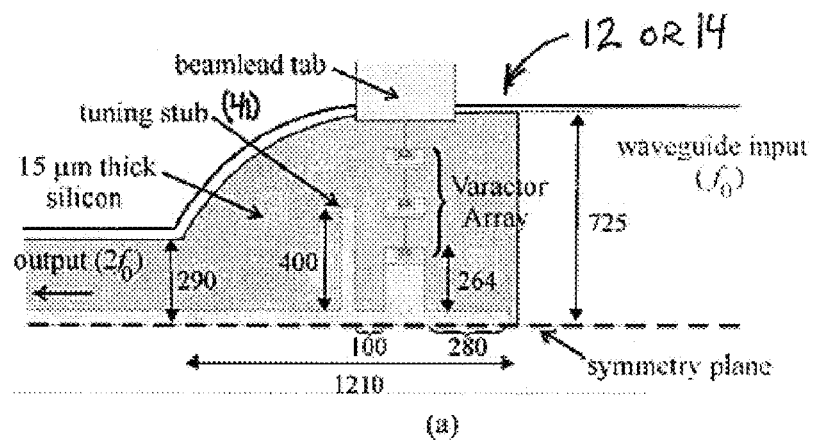
FIGS. 4a-4c are diagrams of the three primary stages of the inventive quadrupler.
Figure 4B:
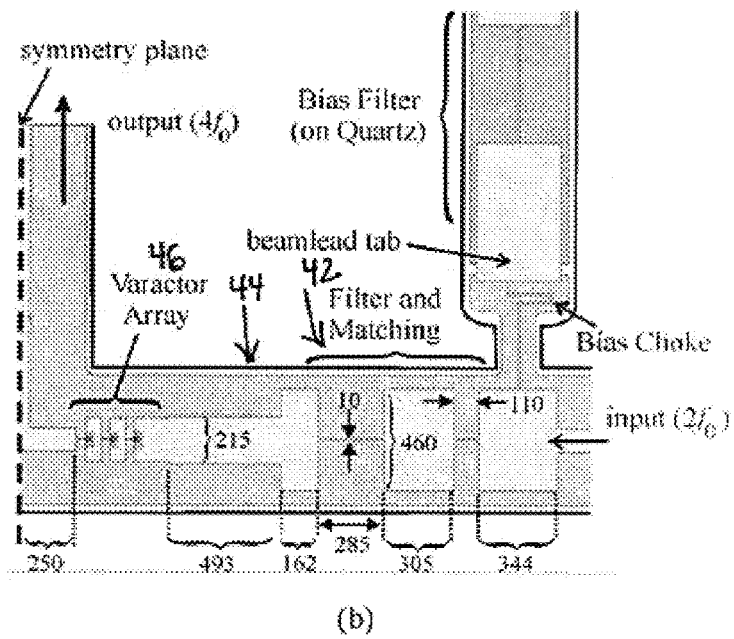
Figure 4C:
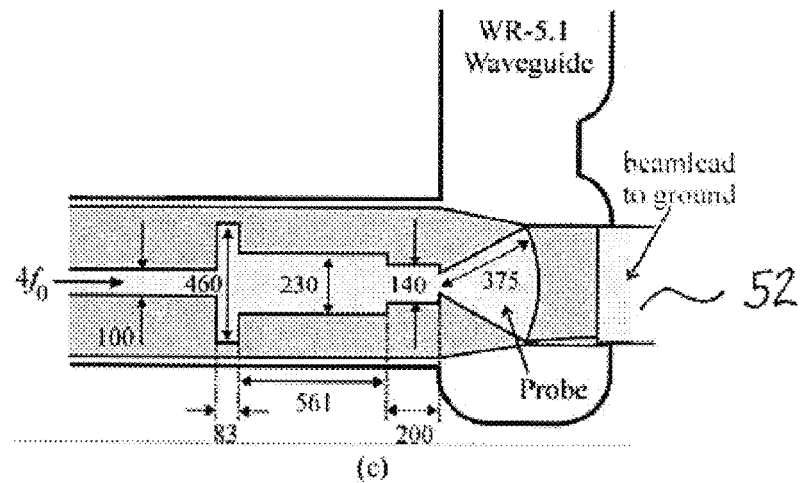

FIG. 3 shows the detail of the waveguide stepped-impedance network 30 and FIG. 4($a$) is a rendering of the top-half of the geometrically-symmetric input stage, detailing the transition from reduced-height waveguide to the diode array and suspended stripline output circuit. The input frequency and available power determine the varactor anode size, substrate doping, epilayer thickness, and the number of diodes required for the doubler, as these parameters directly impact the diode series resistance, breakdown voltage, and onset of velocity saturation. The GaAs epitaxy was selected to have an epitaxial modulation (n) layer 200 nm thick with doping concentration of $2 \times 10^{17}$ cm$^{0.3}$ and a 1 µm thick highly-doped ($5 \times 10^{18}$cm$^{-3}$) n+buffer layer. With an anode diameter of 9.6 µm, these parameters yield diodes with zero-bias junction capacitance of 107 fF, reverse breakdown of approximately 9.5 V, and velocity saturation current of 460 mA. Current-voltage measurements of test diodes fabricated with the quadrupler circuit 10 yielded a series resistance for these devices of 0.4 Ω.

The optimum embedding impedances to present to the diodes in the input-stage doubler were 10+j70Ω for the source impedance 21 at 40 Ghz and 20+j35Ω for the output load at 80 Ghz. The stepped-impedance waveguide transformer of FIG. 3 was designed to present this impedance to each diode 11, 13 of the six-element diode array 12, 14 at 40 GHz.

FIG. 4$a$) shows the circuit features of the first-stage doubler geometry 12 or 14 which transitions from reduced-height waveguide to suspended stripline. The symmetry plane is represented as an electric wall for the input fundamental signal, which is essentially unaffected by the stripline circuit to the left of the diode array as it lies along a perfectly conducting boundary. The impedance presented to a diode by the circuit was determined using Ansofts's High-Frequency Structure Site (HFSS) to analyze the structure of FIG. 4($a$). For the output second harmonic, a magnetic wall boundary condition is imposed on the symmetry plane and the output circuit designed accordingly to present an impedance of 20+j35Ω to each diode in the array 12 or 14 at 80 GHz. This matching circuit consists of a 74Ω transmission line section and shunt stub 41 of length 400 µm placed 100 µm from the diode array.

Figures 5A, 5B:
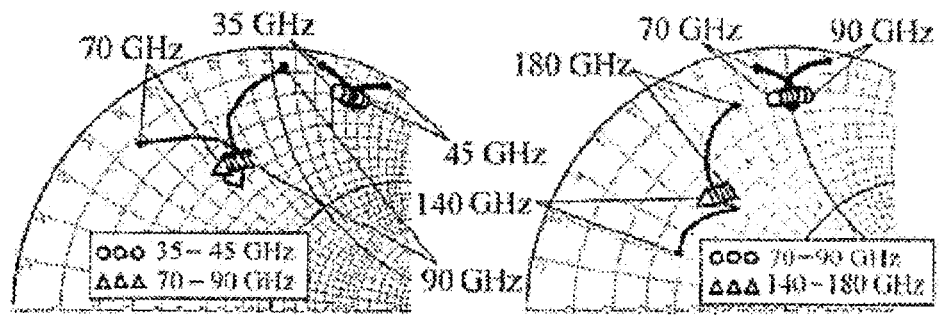
FIGS. 5a and 5b graphically illustrate the input and output impedance of the input-stage doubler (FIG. 5a) and the output stage doubler (FIG. 5b). The symbols represent the optimum impedances found from harmonic balance and the solid lines represent the impedances presented by the matching networks of FIGS. 4a-4c.

FIG. 5$a$) shows the impedances presented to the diodes in the input and output stage circuits of FIG. 4($a$)as well as the optimum impedances found from harmonic balance.

The geometry of the intermediate seed(n of the multiplier, extending from the output of the first-stage doubler 12, 14 to the input of the second-stage doubler 24, it shown in FIG. 4($b$). This section includes a lowpass filter 42 for the 80 GHz output of the first-stage doubler followed by a stepped-impedance transformer 44 that presents 10+j50Ω to the diodes 46 at the input of the second-stage doubler 24. Because the outputs of the first-stage doublers 12, 14 are out-of-phase, the symmetry plane of FIG. 4($b$) is an electric boundary for the input at 80 GHz. This virtual electric boundary extends along the quadrupler output circuit, effectively removing its influence on the input at signal at 2fo (80 GHz).

As with the input doubler stage, optimum impedances for the diodes of the output doubler stage (10+j50Ω at 80 GHz and 20+j25Ω at 160 GHz) are found using harmonic balance analysis with ADS. The varactor diodes for the output stage make use of the same epitaxy as the input doubler, but the anode diameter is sealed to 8 µm to provide a zero-bias junction capacitance of 75 fF. FIG. 5($b$) shows the impedances presented to a diode in the second-stage doubler found from harmonic balance and HFSS simulations of the structure of FIG. 4($b$).

The final step of the quadrupler design consists of transforming the output impedance of the second-stage doubler 24 to the TE 10 mode impedance of the output waveguide, maximizing power coupled to the output WR-5.1 waveguide at 160 GHz. The output-matching network (FIG. 4$c$) consists of a simple shunt stub and stepped-impedance strip line section that transforms the waveguide probe impedance to 20+j25Ω to the diodes of the doubler array. A thin line (6 µm) edge of the waveguide probe to the beamlead tab 52 provides ground for the diode of the second-stage doubler.

Final design and optimization of the quadrupler 10 is accomplished with a modular approach where the circuit is partitioned into its primary sections, as described above, and each analyzed using HFSS. Scattering parameters obtained for the matching networks from HFSS are imported into ADS to perform harmonic balance analysis and determine the resulting multiplier performance. This process is iterated, adjusting the geometry of the circuit each time, to bring the impedances presented to the varactors close to their optimum values.

FIG. 6 shows the final geometry of the quadruple chip resulting from this design process. The chip is a single drop-in unit, approximately 7.5 mm in length, made of 15 µm thick high-resistivity (>10 k Ω-cm) silicon that incorporates three sets of balanced doublers 12, 14, 24 (totaling 18 varactor diodes) with associated matching networks 62, 64, 66, and includes gold beamlead tabs 72, 74, 76, 78, 80, and 82 extending from the chip perimeter to accommodate alignment impedances.

The beamlead tabs 74, 74' and 80, 80' protruding from the circuit at the two input-stage doublers 12 and 14 and the beamlead tab 72 protruding from WR-5.1 output probe 102 provide grounding and support the circuit as it is clamped in the split-block seam 104 of the housing 100 (FIG. 7) during assembly. Two additional beamleads 76 and 82 protrude from hairpin bias chokes 110 and 112 and are bonded to quartz-supported filters 114 and 116 to provide DC bias to the doubler arrays.

Fabrication of the multiplier chip shown in FIGS. 1 and 6 is based on the inventors' quasi-vertical diode architecture and fabrication process described in their co-pending U.S. patent application. (Atty Docket 151093), which claims the benefit of U.S. Provisional Application No. 62/043,698, filed Aug. 29, 2014, and in Chapter 4 of Alijabban, N. (2014), "Submillimeter-Wave Quasi-Vertical GaAs Schottky Diodes Integrated on Silicon Membranes" (retrieved from http://libra.virginia.edu/catalog/libraoa: 7744), all of which are incorporated herein by reference in their entireties.

This quasi-vertical diode geometry has an integrated bottom ride ohmic contact that is bonded to a host substrate. More specifically, its geometry includes a topside anode contact that connects to external circuitry through an air-bridge finger, a thin (1 µm or less) mesa of semiconductor material (e.g., GaAs) with appropriate epilayers for the diode application, including a bottomside highly-doped layer, a bottomside ohmic contact that lies directly below the anode, a thin bonding layer below the ohmic contact, and a host substrate (such as high-resistivity silicon or diamond) onto which the diode material has been attached.

The bottom ohmic contact is characterized in that it (1) can be placed in close proximity to the anode contact, (2) allows current to flow through the bulk semiconducting material rather than along the surface, (3) can be bonded to a variety of substrate materials to address thermal grounding or loss issues, and (4) remains compatible with integration into planar circuit architectures.

In broad terms, the fabrication process includes the following steps (1) preparation of a semiconductor wafer for processing (including initial etching of material to expose a highly-doped (n++) epilayer, (2) deposition of metals and annealing to form the ohmic contact art the bottom side of the semiconductor wafer to create a diode wafer, (3) application of an adhesive bonding layer (such as spin-on-glass) to the host substrate, (4) thermal compression bonding of the diode wafer 300 and host substrate wafer, with the ohmic contact side of the diode wafer 300 facing the host substrate wafer to form a composite wafer, (5) etching and formation of diode mesas to isolate devices on the host substrate, (6) lithography and formation of topside anode contact and external circuitry on the host substrate wafer.

A keys step of the process is transfer of the GaAs epitaxy to a silicon-on-insulator (SOI) substrate that serves as the final carrier chip for the diodes and their associated circuitry. After initial formation of the device ohmic contacts, the diode epitaxy is bonded, ohmic contact-side-down, to the SOI substrate. Following this step, most of the GaAs is etched from the wafer, leaving only mesas for fabrication of the diodes. The remaining features of the diodes and multiplier circuits (anode, contact finger and cathode metallization) are fabricated using standard lithographic, metal deposition, and etching processes.

Following the diode processing steps, the wafer is bonded topside-down to a temporary carrier wafer, revealing the backside silicon handle of the SOI. This "handle" silicon is removed through reactive ion etching to the buried oxide layer, which acts as an etch stop. Buffered hydrofluoric (HF) acid is used to etch the oxide, leaving the multiplier circuits on a thin (15 µm) high-resistivity silicon membrane bonded to the carrier. A backside reactive-ion "extents" etch is used to separate the multiplier chips and define their geometry. The final step in the process is removal of the temporary carrier wafer, releasing the individual chips.

Figure 7:
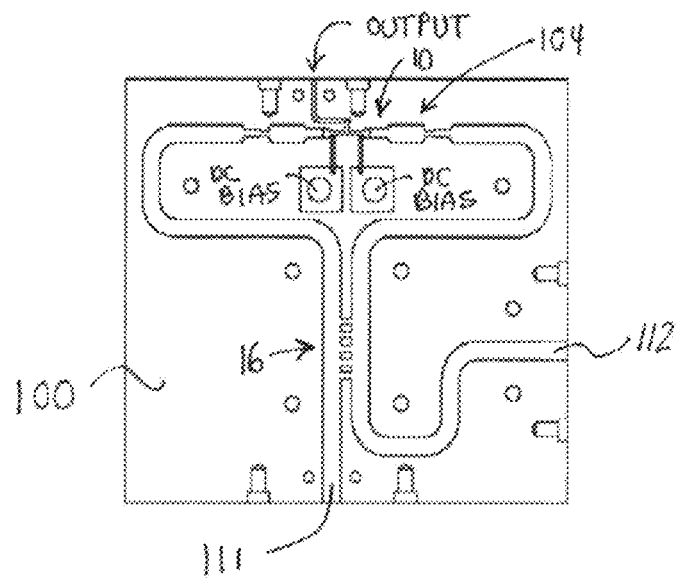
FIG. 7 is a planar diagram of a quadrupler housing assembly showing the mounted chip of FIG. 6 and waveguide design features.

With reference to FIG. 7, the housing 100 for the quadrupler circuit 10 is fabricated as an E-plane split-block assembly from gold-plated aluminum using standard milling methods. The housing includes a coupler (e.g., a WR-22 3-dB stepped branchline coupler) to provide in-phase and quadrature inputs to the quadrupler chip waveguide, sections, and channels to accommodate quartz-supported filters for bias connections. External bias is supplied to the chip through low-profile GPPO connectors. The input 111 and isolation port 112 of the multiplier are configured to mate with the waveguides.

Beamlead tabs protruding from the chip at the two input-stage doublers and the output provide grounding and support the circuit as it is clamped in the split-block seam of the housing during assembly. Two additional beamleads protrude from hairpin bias chokes and are bonded to quartz-supported filters to provide DC bias to the diode arrays. The multiplier 10 can be implemented in either planar circuit, quasi-optical, or waveguide media (as illustrated in the previous figures) and is amenable to integrated fabrication technology.

Measurement of the quadrupler 10 was done at the University of Virginia and repeated at Virginia Diodes, Inc., to ensure consistent results were obtained.

Figure 9A:
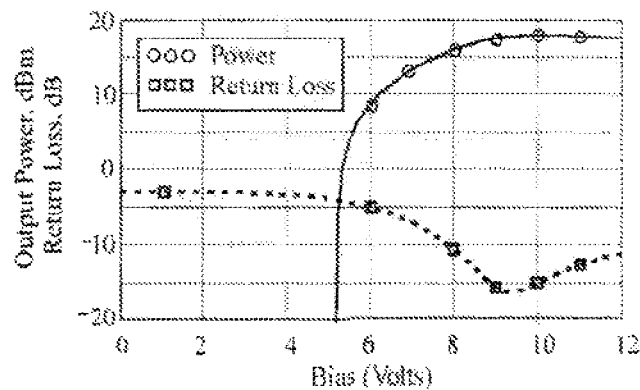
FIG. 9a is a graph showing power and return loss of the inventive quadrupler as a function of bias.
Figure 9B:
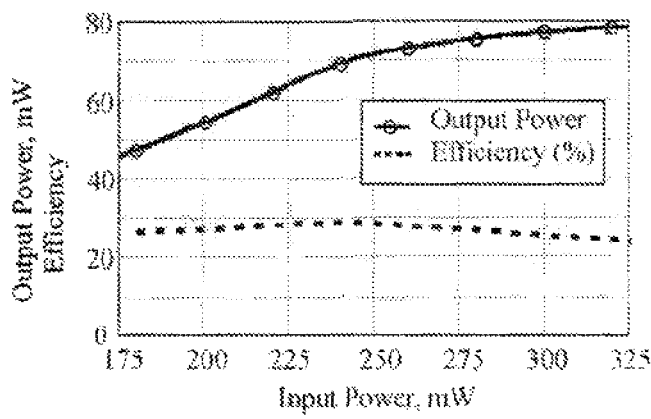
FIG. 9b is a graph showing output power and efficiency of the inventive quadrupler at a bias of −10 V and input power of 220 mW as a function of input power.

FIG. 9(a) shows the measured output power of the quadrupler at 160 GHz as the (reverse) bias voltage to the diodes is varied. With 220 mW of available power at the input, a peak output power of 62 mW is obtained at a bias of −10 V. FIG. 9(a) also shows the return loss from the quadrupler, determined from the ratio of power measured at the isolation port to the available power at the input, as bias is varied. Below a bias voltage of −6 V, no output power was measured. The quadrupler output power at 160 GHz and bias of −10 V as a function of input power is shown in FIG. 9(b). Over the 175-325 mW range of input power applied, the quadrupler efficiency remained approximately 25% or better, with a maximum efficiency near 30% at an input power of 240 mW. At an applied input power of 325 mW, an output of 79 mW was obtained at 160 GHz.

Figure 9C:
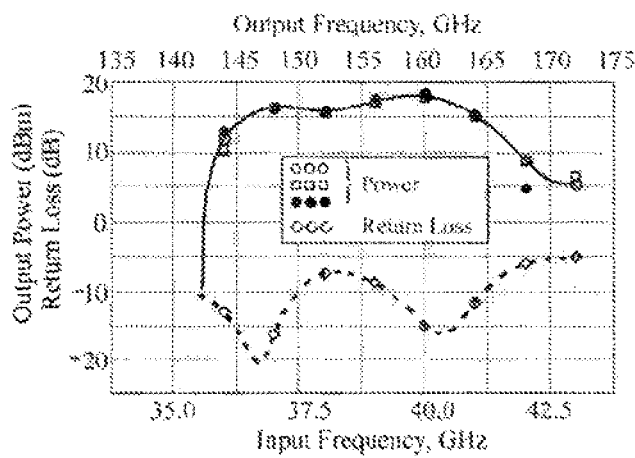
FIG. 9c is a graph showing output power and return loss of the inventive quadrupler.

FIG. 9(c) shows the multiplier output power and return loss over the 142-172 GHz output frequency range, corresponding to the 36-43 GHz bandwidth of the input amplifier. These measurements were performed with 220 mW of input power and a voltage bias of −10 V. The 3 dB output bandwidth of the quadrupler as approximately 20 GHz, or 13%. The three sets of power data presented in FIG. 9c correspond to separate assemblies of the quadrupler, each using different chips, illustrating a high degree of repeatability and consistency in performance resulting from the integrated architecture of the multiplier.

Figure 10A:
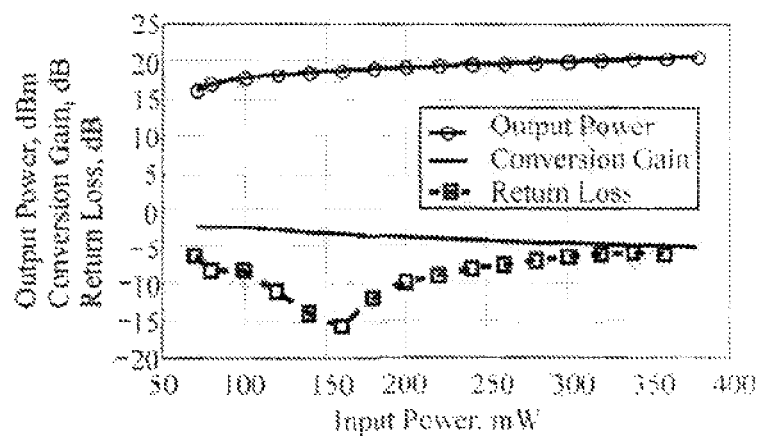
FIG. 10a is a graph illustrating the the output power, conversion gain, and return loss of the input-stage doubler of the inventive quadrupler at an input frequency of 40 GHz and bias Of −10 V as a function of available power.
Figure 10B:
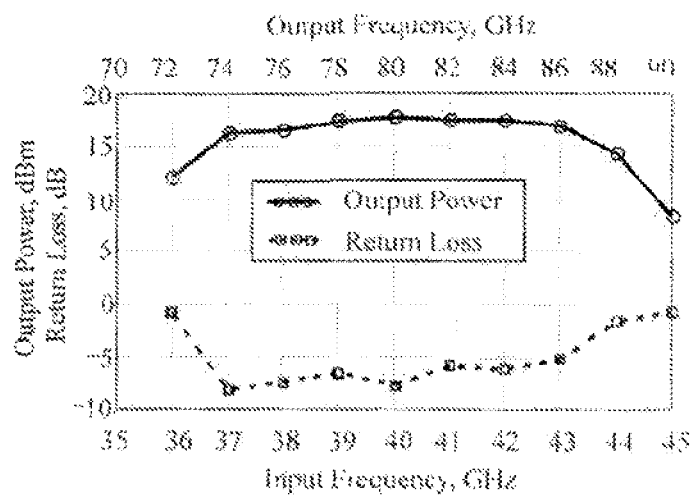
FIG. 10b is a graph illustrating output power and return loss of the doubler of the inventive quadrupler as function of frequency.

The RF performance of the doubler is summarized in FIGS. 10(a) and 10(b). A peak doubler efficiency of 62% (conversion gain of −2.2 dB) was achieved at 80 GHz for an input available power of 100 mW and bias of −10 V. The 3 dB bandwidth of the doubler (FIG. 10(a)) is approximately 18% and a maximum output power of 113 mW was achieved at 80 GHz with at input of 380 mW (the upper power limit of the Spacek amplifier). Above 400 mW of applied input power, the voltage swing across the diodes is predicted, from harmonic balance analysis, to exceed 9.5 V breakdown voltages of the diodes.

Figure 11A:
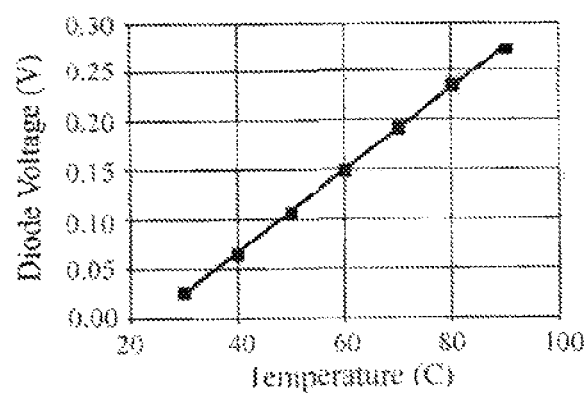
FIG. 11a is a graph showing measured change in diode voltage as a function of temperature.
Figure 11B:
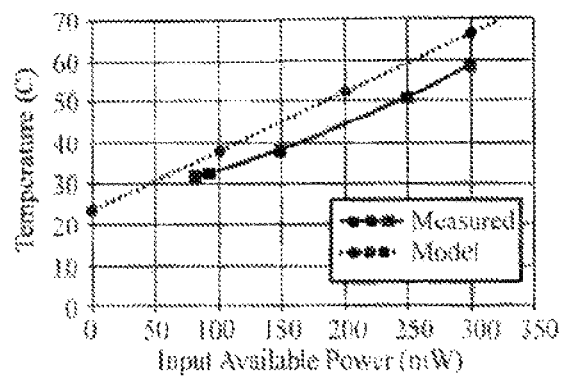
FIG. 11b is a graph showing estimated anode temperature of the integrated doubler as a function of input power.

To estimate the operating temperature of the varactors comprising the doubler, the current-voltage characteristic of the diodes was used as an in-situ thermometer. Initially, a set of DC current-voltage measurements of the six-element diode array were taken at temperatures ranging from 25° C. to 90° C. These measurements were done with the doubler chip placed on a temperature-controllable hot plate, after the diodes were allowed to reach thermal equilibrium. Data taken from these measurements served as a calibration to permit the temperature of the diodes to be estimated when subjected to RF power. FIG. 11(a) shows the change in voltage drop across the diodes found from this measurement, at a fixed current bias of 100 µA and as a function of applied temperature. The estimated temperature of the diodes in the doubler circuit as a function of available input power at 40 GHz is provided in FIG. 11(b). For this measurement, the doubler was pumped with the input RF signal at a fixed power for several seconds. Afterwards, the input power source was removed, a current bias of 100 µA was immediately applied, and the diode voltage was sampled and monitored over a time interval of 50 ms. Using the measured voltages, extrapolating, and applying the calibration data of FIG. 11(a) allowed the temperature of the varactors to be estimated. Although this method cannot give temperature estimates for the individual diodes in the array, it does provide a measure of the approximate temperature rise of the devices when subjected to high input power levels. When driven at 100 mW for peak efficiency, the temperature of the varactors is estimated from these measurements to be 35° C., approximately 30° C. lower than that calculated for the substrateless 100-200 GHz doubler and over 100° C. cooler than the GaAs membrane multiplier investigated in [101], for the same input power.

An aspect of various embodiments of the present invention may provide a number of novel and nonobvious features, elements and characteristics, such as but not limited thereto: (1) incorporation of a hybrid coupler 16 to drive a pair of balanced doublers 12, 14 in phase quadrature combined with (2) integration of an output balanced doubler 24 that bridges the output nodes 15, 17 of the pair of input balanced doublers.

An aspect of various embodiments of the present invention may be utilized for a number of products and services. Frequency multipliers are currently the most widely used and important technology for realizing solid-state frequent sources above 100 GHz. Multipliers are used as local oscillators for high-frequency receivers, frequency upconverters in commercial network analyzer extension modules (currently marked by a number of companies), and as sources for spectroscopic measurements.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described. For example, as with the 40/160 GHz quadrupler, the input of cascaded balanced multipliers, such as that shown in FIG. 8 would not load the driving stages and eliminates issues associated with cascading multipliers in a large chain. The reflected power from mismatches between stages would be terminated, allowing one to reach the 640 GHz and beyond with fewer multiplier blocks (or several chips integrated into a single block).

The devices, systems, compositions and computer readable medium, and methods of various embodiments of the invention disclosed herein may utilize aspects disclosed in the following references, applications, publications and patents and which are hereby incorporated by reference herein in their entireties (and which are not admitted to be prior art with respect to the present invention by inclusion in this section):

PUBLICATIONS

J. W. Gewartowski, "Unilateral Frequency Multiplier Circuit" Proceedings of the IEEE pp. 1749-1750, December 1964.

R. D. Brooks, J. W. Gewartiowski, "Unilateral 6-GHz 2 ½-Watt Varactor Quadrupler," IEEE Trans. Solid-State Circuits VOL. SC-3, NO. 2, JUNE 1968, pp. 182-189.

N. Erickson, "High efficiency submillimeter frequency multipliers," in IEEE MTT-S Int. Microwave Symp. Dig., 1990, pp. 1301-1304, N. Erickson, B. Rizzi, and T. Crowe, "A high-power doubler for 174 GHz using a planar diode array," in Proc. 4th Int. Space THz Tech. Symp., March 1993, pp. 287-296.

D. W. Porterfield, et al, "A High-Power Fixed-Tuned Millimeter-Wave Balanced Frequency Doubler," IEEE Trans. Microwave Theory and Tech. vol. 47, no. 4, pp. 419-425, 1999.

ADDITIONAL REFERENCES

U.S. patent application Ser. No. 13/699,255 entitled "MICROMACHINED ONWAFER PROBES AND RELATED METHOD," filed Nov. 20, 2012; Patent Application Publication No. 2013/0106456, May 2, 2013.

International Patent Application No. PCT/US2011/037473 entitled "MICROMACHINED ON-WAFER PROBES AND RELATED METHOD," filed May 20, 2011.

U.S. patent application Ser. No. 12/530,304 entitled "Method of Local Electro-Magnetic Field U.S. patent application Ser. No. 13/699,255 entitled "MICROMACHINED ON-WAFER PROBES AND RELATED METHOD," filed Nov. 20, 2012; U.S. Patent Application Publication No. 2013/0106456 May 2, 2013.

International Patent Application No. PCT/US2011/037473, entitled "MICROMACHINED ON-WAFER PROBES AND RELATED METHOD," filed May 20, 2011.

U.S. patent application Ser. No. 09/988,203 entitled "INTEGRATION OF HOLLOW WAVEGUIDES CHANNELS AND HORNS BY LITHOGRAPHIC AND ETCHING TECHNIQUES," filed Nov. 19, 2001.

U.S. patent application Ser. No. 09/381,744 entitled "Integration of Hollow Waveguides, Channels and Horns by Lithographic and Etching Techniques," filed Apr. 6 2000.

International Patent Application. No. US98/05828, entitled "INTEGRATION OF HOLLOW WAS WAVEGUIDES, CHANNELS AND HORNS BY LITHOGRAPHIC AND ETCHING TECHNIQUES," filed Mar. 25, 1998.

International Patent Application No. PCT/US1998/05830, entitled "METHOD OF FABRICATING A MILLIMETER OR SUBMILLIMETER WAVELENGTH COMPONENT," filed Mar. 25, 1998.

U.S. patent application Ser. No. 09/381,746 entitled "Preferential Crystal Etching Technique for the Fabrication of Millimeter and Submillimeter Wavelength Horn Antennas," filed Mar. 25, 1998.

International Patent Application No. US98/05831, entitled "A PREFERENTIAL CRYSTAL ETCHING TECHNIQUE FOR THE FABRICATION OF MILLIMETER AND SUBMILLIMETER WAVELENGTH HORN ANTENNAS," filed Mar. 25, 1998.

What is claimed is:

1. A frequency multiplier comprising:
an input for receiving an input signal of a fundamental frequency;
a pair of balanced frequency doublers each having an output node;
a second-stage balanced doubler including anti-series connected diodes, the second-stage balanced doubler bridging the output nodes of the pair of balanced frequency doublers;
and
a quadrature hybrid connected to the input for driving the pair of balanced frequency doublers in phase quadrature so that the pair of balanced frequency doublers each have an output signal, the two output signals being at twice the fundamental frequency and out of phase and which are used to drive the second-stage balanced doubler thus producing a single output signal at a frequency four times the input signal.

2. The frequency quadrupler of claim 1, wherein the pair of balanced frequency doublers each comprise a pair of quasi-vertical GaAs varactors joined together in anti-series.

3. The frequency quadrupler of claim 1, wherein each one of the pair of frequency doublers is identical.

4. The frequency quadrupler of claim 1, wherein the output signal of the second-stage balanced doubler is a fourth-order harmonic.

5. A frequency quadrupler comprising:
a first input for receiving an input signal of a fundamental frequency;
a first pair of balanced frequency doublers each having an output node;
a first second-stage balanced doubler including anti-series connected diodes, the second-stage balanced doubler bridging the output nodes of the pair of frequency doublers;
a first quadrature hybrid connected to the first input for driving the first pair of balanced frequency doublers in phase quadrature so that the first pair of balanced frequency doublers each have an output signal, the two output signals being twice the fundamental frequency and out of phase and which are used to drive the first second-stage balanced doubler thus producing a single output signal at a frequency four times the input signal;
a second input for receiving the output signal from the first second-stage balanced doubler;
a second pair of balanced frequency doublers each having an output node;
a second second-stage balanced doubler including anti-series connected diodes, the second-stage balanced doubler bridging the output nodes of the pair of frequency doublers;
and
a second quadrature hybrid connected to the second input for driving the second pair of balanced frequency doublers in phase quadrature so that the second pair of balanced frequency doublers each have an output signal, the two output signals being twice the fundamental frequency and out of phase and which are used to drive the second second-stage balanced doubler thus producing a single output signal at a frequency 16 times the first input signal.

6. The frequency quadrupler of claim 5,
wherein the four balanced frequency doublers each comprise a pair of quasi-vertical GaAs varactors joined in anti-series.

7. The frequency quadrupler of claim 5, wherein each one of the first and second pairs of frequency doublers is identical.

8. The frequency quadrupler of claim 5, wherein the first and second quadrature hybrids respectively feeds the first and second pairs of frequency doublers in phase quadrature.

9. The frequency quadrupler of claim 5, wherein the output signal of the first second-stage balanced doubler is a fourth-order harmonic and the output signal of the second second-stage balanced doubler is a fourth-order harmonic.

* * * * *